United States Patent [19]
Freitag et al.

[11] Patent Number: 5,999,549
[45] Date of Patent: Dec. 7, 1999

[54] METHOD AND APPARATUS FOR LASER SAFETY

[75] Inventors: Ladd W. Freitag, Rochester; David Warren Siljenberg, Byron; Raymond Jonathan Thatcher, Rochester, all of Minn.

[73] Assignee: International Business Machines Corporation, Armonk, N.Y.

[21] Appl. No.: 09/020,553

[22] Filed: Feb. 9, 1998

[51] Int. Cl.[6] .................................................. H01S 3/00
[52] U.S. Cl. .............................. 372/38; 372/25; 372/29; 372/33
[58] Field of Search ................................ 372/9, 24, 25, 372/26, 29, 30, 33, 38

[56] References Cited

U.S. PATENT DOCUMENTS

| | | | |
|---|---|---|---|
| 4,262,366 | 4/1981 | Eumurian | 455/612 |
| 4,685,097 | 8/1987 | van der Put | 369/54 |
| 4,713,819 | 12/1987 | Yoshikawa | 372/9 |
| 4,856,011 | 8/1989 | Shimada et al. | 372/38 |
| 4,884,275 | 11/1989 | Simms | 372/9 |
| 5,296,695 | 3/1994 | Bardos et al. | 372/38 X |
| 5,585,605 | 12/1996 | Williams et al. | 178/18 |
| 5,665,942 | 9/1997 | Williams et al. | 178/18 |
| 5,666,045 | 9/1997 | Grodevant | 372/38 X |
| 5,764,666 | 6/1998 | Wakabayashi et al. | 372/38 |

OTHER PUBLICATIONS

IBM Technical Disclosure Bulletin, vol. 33, No. 3B., Aug. 1990, pp. 90 and 91, and entitled Laser Fault Detection.

*Primary Examiner*—Brian Healy
*Attorney, Agent, or Firm*—Joan Pennington; Roy W. Truelson

[57] ABSTRACT

A method and apparatus are provided for laser safety. A fault detector detects laser fault conditions and generates a laser fault control signal. A laser fault counter is coupled to the fault detector for counting laser fault conditions and for generating a disable laser control signal responsive to a predetermined fault count. A reset timer is coupled to the laser fault counter for identifying a predetermined reset time period responsive to the laser fault control signal and applying a reset signal to the laser fault counter. Features of laser safety method and apparatus of the invention are that the laser fault counter is reset if a second laser fault condition is not detected within the predetermined reset time period after the laser is turned on. The disable laser control signal is not generated when a safe laser optical power condition occurs between two laser fault conditions.

7 Claims, 3 Drawing Sheets

METHOD AND APPARATUS FOR LASER SAFETY

CONTRACTUAL ORIGIN OF THE INVENTION

This invention was made with government support under Cooperative Agreement F33615-94-2-1582 awarded by the United States Department of Air Force. The government has certain rights in the invention.

FIELD OF THE INVENTION

The present invention relates to improvements in laser driver and fault detection arrangements for laser safety.

DESCRIPTION OF THE PRIOR ART

Many types of laser-based devices and systems, having a wide range of applications, such as in medical technology, in communications and computing technology, are becoming increasingly well known and commercially available. The lasers used in many of these devices and systems are often capable of producing powerful outputs that are potentially harmful to both people and equipment. As a result, many types of safety devices for use in conjunction with laser-based equipment, and standards designed to ensure that laser-based equipment may be safely operated, have been developed and continue to evolve.

A function of a laser's DC current drive feedback loop is to maintain constant optical power. Known fault detection circuits monitor for conditions that indicate an unsafe laser optical power exists. Fault detection schemes exist similar to that reported in the IBM Technical Disclosure Bulletin Vol. 33, No. 3B., August 1990, pages 90 and 91, and entitled LASER FAULT DETECTION.

FIG. 1 illustrates a prior art DC laser driver and laser fault detection circuits. The DC current driver is accomplished by including an operational amplifier (op amp) in a negative feedback loop consisting of op amp B1, transistors Q1 and Q2, resistor R1, the laser diode, the monitor diode, and potentiometer RPOT. The monitor diode current, LM, is fed back through potentiometer RPOT. When the laser diode current increases, the monitor diode current increases. This causes the voltage on the + terminal of op amp B1 to decrease, providing the negative feedback. The regulator monitor detects when the bandgap regulator voltage goes above 3V, which could cause a laser over power condition. The window detector determines when the + terminal of the DC op amp B1 goes above 1.65V or below 1.35V. An open on the monitor diode connection would cause the voltage on the + terminal of the DC op amp B1 to increase above 1.65V. High laser optical power would cause the + terminal of the DC op amp B1 to decrease below 1.35V. When a fault is detected, the timing capacitor is charged. If the fault in still present when the timer expires, the PNP transistor Q2 is shut off, the + terminal of the DC op amp is forced low, and the output LASER FAULT is forced high. The power on reset (POR) initialization circuit clears all faults until the laser is powered up. The laser can be turned on by an external control signal LASER ON, and a fault can be cleared by an external control signal LASER RESET.

SUMMARY OF THE INVENTION

A principal object of the present invention is to provide an improved method and apparatus for laser safety. Other objects of the invention are to provide such method and apparatus substantially without negative effects, and that overcome disadvantages of prior art arrangements.

In brief, a method and apparatus are provided for laser safety. A fault detector detects laser fault conditions and generates a laser fault control signal. A laser fault counter is coupled to the fault detector for counting laser fault conditions and for generating a disable laser control signal responsive to a predetermined fault count. A reset timer is coupled to the laser fault counter for identifying a predetermined reset time period responsive to the laser fault control signal and applying a reset signal to the laser fault counter.

In accordance with features of the invention, the laser fault counter is reset if a second laser fault condition is not detected within the predetermined reset time period after the laser is turned on. The disable laser control signal is not generated when a safe optical power condition occurs between two laser fault conditions.

BRIEF DESCRIPTION OF THE DRAWING

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
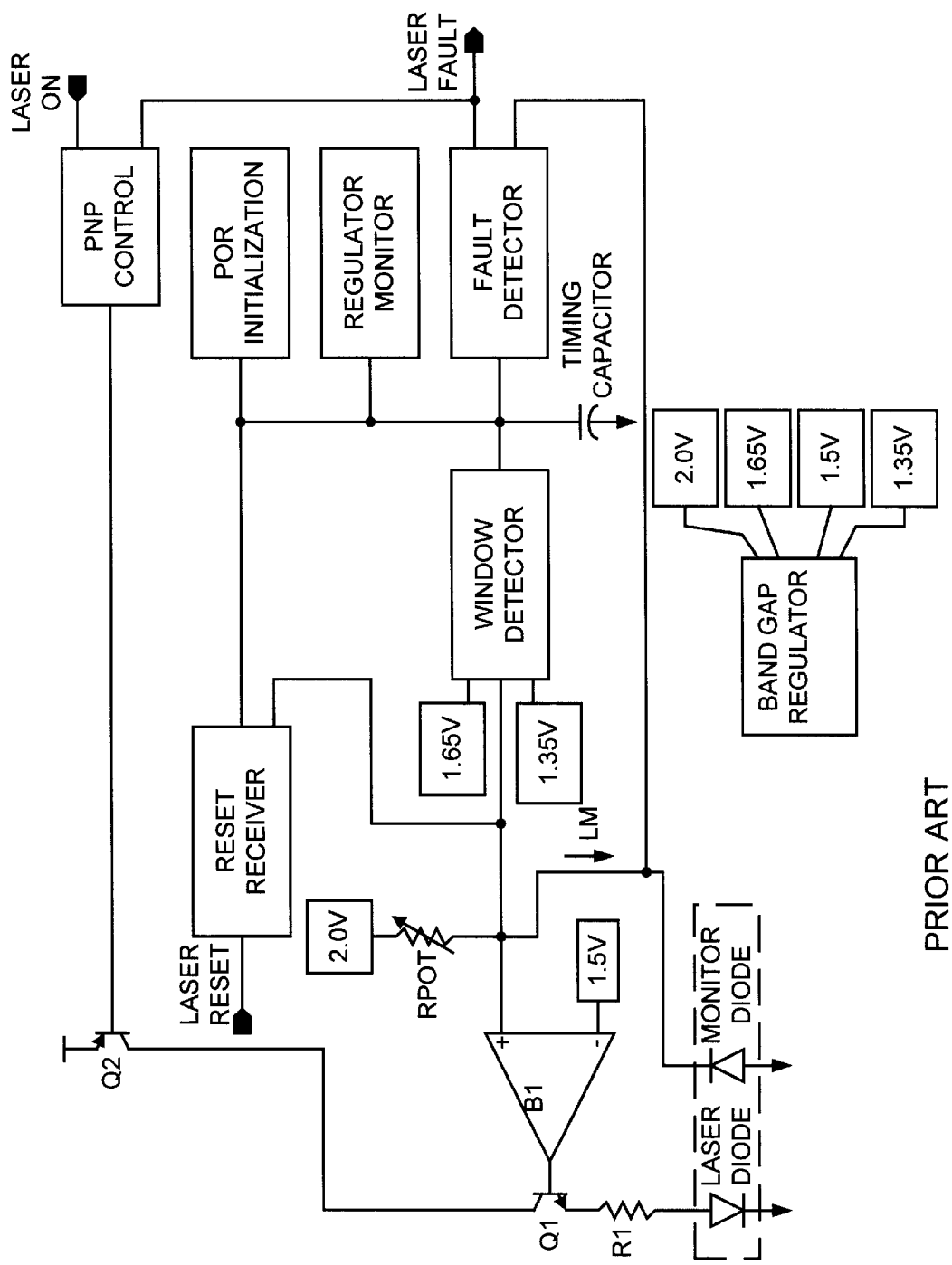
FIG. 1 is a schematic and block diagram representation of a conventional DC laser driver and fault detection circuit.
Figure 2:
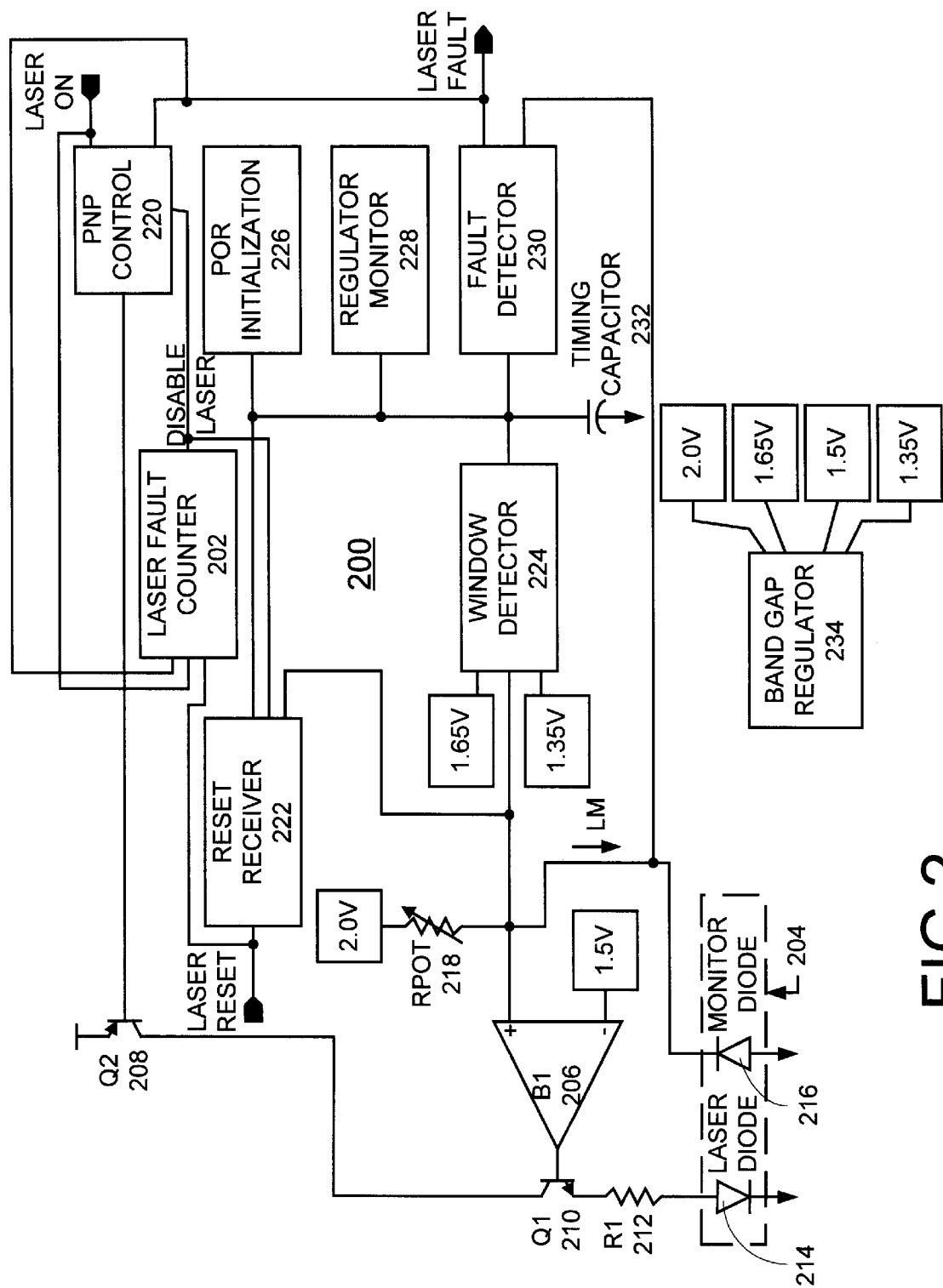
FIG. 2 is a schematic and block diagram representation of a DC laser driver and fault detection circuit of the preferred embodiment.

Having reference now to the drawings, in FIG. 2, there is shown a DC laser driver and fault detection circuit generally designated by 200. The DC laser driver and fault detection circuit 200 of FIG. 2 includes the circuitry of FIG. 1 with an added laser fault counter 202 of the preferred embodiment. A laser diode and monitor diode are generally designated by 204.

In accordance with a feature of the invention, the laser fault counter 202 counts the number of optical power fault conditions that occur when LASER RESET and LASER ON signals are used to turn the laser on. For example, when two consecutive laser fault conditions occur, the laser fault counter 202 generates a control signal DISABLE LASER.

The DC laser driver and fault detection circuit 200 includes an operational amplifier B1 206, a PNP transistor Q2 208, an NPN transistor Q1 210, a resistor R1 212, a laser diode 214, a monitor diode 216 and a potentiometer RPOT 218 arranged to provide drive current for constant optical power to the laser. An external LASER ON signal is applied to a PNP control 220 that operatively control the PNP transistor Q1 208. The DC laser driver and fault detection circuit 200 includes a reset receiver 222, a window detector 224, a POR initialization 226, a regulator monitor 228, a fault detector 230, a timing capacitor 232 and a band gap regulator 234. The band gap regulator 234 provides multiple voltages, 2.0V, 1.65V, 1.5V and 1.35V. The monitor diode current, LM, is fed back through potentiometer RPOT 218. When the laser diode current increases, the monitor diode current increases. This causes the voltage on the + terminal of op amp B1 206 to decrease, providing the negative feedback. The POR initialization 226 clears all faults until the laser is powered up. The regulator monitor 228 detects when the bandgap regulator voltage goes above 3V, which could cause a laser over power condition. The fault detector 230 generates a control signal LASER FAULT in response to a detected unsafe laser optical power fault condition.

The external LASER ON signal is applied to the laser fault counter 202. The external LASER RESET signal is applied to the reset receiver 222 and the laser fault counter 202. A window detector 224 detects when the + terminal of the DC op amp B1 goes above 1.65V or below 1.35V. An open on the monitor diode connection would cause the voltage on the + terminal of the DC op amp to increase above 1.65V. High laser optical power would cause the + terminal of the DC op amp B1 to decrease below 1.35V.

When a fault is detected, the timing capacitor 232 is charged. If the fault in still present when the timer expires, the output LASER FAULT of the fault detector 230 is forced high, the PNP transistor Q2 208 is shut off by the PNP control 220 responsive to the control signal LASER FAULT, and the + terminal of the DC op amp is forced low. The control signal LASER FAULT is applied to the PNP control 220 and to the laser fault counter 202 of the preferred embodiment. The laser can be turned on by an external control signal LASER ON, and a fault can be cleared by an external control signal LASER RESET.

Assume a fault is caused by high optical power out of the laser. The laser 214 would emit this high power until the fault detection 230 shuts the laser down. The duration of this high power pulse is defined by a timing capacitor 232 in FIG. 2. The duration of this pulse, coupled with the frequency of the LASER RESET signal can cause an unsafe laser optical power. The laser fault counter 202 is used to shut down the laser if two consecutive laser faults are counted with no successful laser power up. The laser fault counter 202 is reset if a second fault is not detected within the predetermined time period after the LASER RESET signal goes low and the LASER ON signal goes high. This prevents disabling the laser driver when a safe optical power condition occurs between two laser fault conditions.

Figure 3:
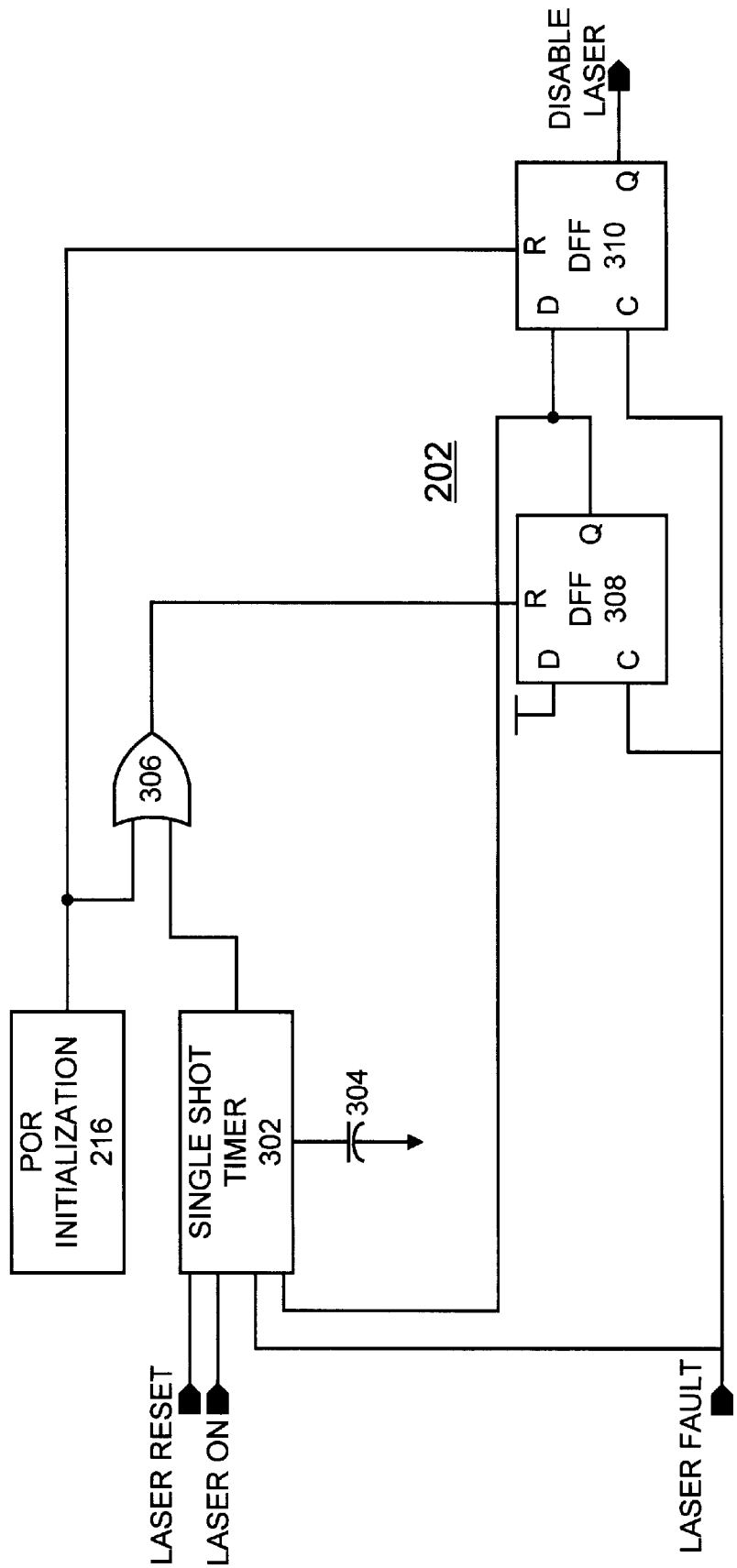
FIG. 3 is a schematic and block diagram representation of a laser fault counter of the DC laser driver and fault detection circuit in accordance with the preferred embodiment.

FIG. 3 shows the laser fault counter 202 in more detail. The laser fault counter 202 includes a retriggerable single shot timer 302 receiving the control signals LASER RESET and LASER ON. A reset capacitor 304 is connected with the single shot timer 302 for defining a reset time period. The laser fault counter 202 includes an OR gate 306 applying a reset input to a first D flip-flop 308 of a pair of D flip-flops 308, 310 responsive to a clear control signal from the POR initialization 216 or responsive to the reset time period. The clear control signal from the POR initialization 216 is applied to a reset input to the second D flip-flop 310. The control signal LASER FAULT is applied to a clock (C) input of the pair of D flip-flops 308, 310. The control signal LASER FAULT also is applied to the single shot timer 302. The data (D) input of the first D flip-flop 308 is set high. The output (Q) of the first flip-flop 308 is applied to the data (D) input of the second D flip-flop 310 and is applied to the single shot timer 302. A low input to the reset inputs of D flip-flops 308, 310 forces a low Q output independent of the clock C or data D inputs. When two consecutive laser faults are counted by the two D flip-flops 308, 310, a control signal DISABLE LASER is applied to the reset receiver 222 of FIG. 2 which forces the + terminal of the DC op amp B1 206 low, and is applied to the PNP control 220 of FIG. 2 which shuts off the PNP transistor Q2 208. If one laser fault is followed by a normal operating condition for a period of time larger than that defined by the reset capacitor 304, the laser fault counter 202 is reset.

While the present invention has been described with reference to the details of the embodiments of the invention shown in the drawing, these details are not intended to limit the scope of the invention as claimed in the appended claims.

What is claimed is:

1. Apparatus for laser safety comprising:

fault detector means for detecting a laser fault condition and generating a laser fault control signal;

counter means coupled to said fault detector means for counting said laser fault conditions and for generating a disable laser control signal, said counter means comprising a pair of flip-flops arranged for counting two laser fault conditions and for generating said disable laser control signal, and timer means coupled to said counter means for identifying a predetermined reset time period responsive to said laser fault control signal and for applying a reset signal to said counter means.

2. Apparatus for laser safety as recited in claim 1 wherein said timer means coupled to said counter means for identifying a predetermined reset time period responsive to said laser fault control signal and for applying said reset signal to said counter means comprises a single shot timer and a reset capacitor coupled to said single shot timer for defining said predetermined reset time period.

3. Apparatus for laser safety as recited in claim 1 wherein said timer means coupled to said counter means for identifying said predetermined reset time period responsive to said laser fault control signal and applying said reset signal to said counter means is responsive to a reset laser control signal for identifying said predetermined reset time period.

4. Apparatus for laser safety as recited in claim 1 further comprising power on reset (POR) initialization means for applying a reset signal to said counter means.

5. A method for providing laser safety comprising the steps of:

detecting a laser fault condition and generating a laser fault control signal;

utilizing a laser fault counter counting at least two successive laser fault conditions and responsive to a predetermined fault count, generating a disable laser control signal, and utilizing a reset timer coupled to said laser fault counter identifying a predetermined reset time period responsive to said laser fault control signal and applying a reset signal to said laser fault counter, whereby said disable laser control signal is not generated when a safe laser optical power condition occurs between laser fault conditions.

6. A method for providing laser safety as recited in claim 5 further includes the step of utilizing said reset timer coupled to said laser fault counter, identifying said predetermined reset time period responsive to a laser reset control signal and applying a reset signal to said laser fault counter.

7. A method for providing laser safety as recited in claim 5 further includes the step of applying a reset signal to said laser fault counter from a power on reset (POR) initialization circuit.

* * * * *